United States Patent
Noguchi

(10) Patent No.: US 12,407,324 B2
(45) Date of Patent: Sep. 2, 2025

(54) ACOUSTIC WAVE DEVICE

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 300 days.

(21) Appl. No.: 18/122,744

(22) Filed: Mar. 17, 2023

(65) Prior Publication Data

US 2023/0223921 A1  Jul. 13, 2023

Related U.S. Application Data

(63) Continuation of application No. PCT/JP2021/034802, filed on Sep. 22, 2021.

(30) Foreign Application Priority Data

Sep. 29, 2020  (JP) ................. 2020-163568

(51) Int. Cl.
*H03H 9/13* (2006.01)
*H03H 9/17* (2006.01)
*H03H 9/54* (2006.01)

(52) U.S. Cl.
CPC .............. *H03H 9/133* (2013.01); *H03H 9/17* (2013.01); *H03H 9/54* (2013.01)

(58) Field of Classification Search
CPC  H03H 9/133; H03H 9/17; H03H 9/54; H03H 9/02; H03H 9/1457; H03H 9/14582; H03H 9/6436
USPC .................................. 333/193–196
See application file for complete search history.

(56) References Cited

U.S. PATENT DOCUMENTS

| | | | |
|---|---|---|---|
| 10,812,043 B2 * | 10/2020 | Takamine | H03H 9/725 |
| 2002/0175783 A1 | 11/2002 | Watanabe et al. | |
| 2005/0190014 A1* | 9/2005 | Saitou | H03H 9/6473 333/195 |
| 2011/0204984 A1 | 8/2011 | Yamanaka | |
| 2017/0093371 A1 | 3/2017 | Takamine | |

FOREIGN PATENT DOCUMENTS

| | | |
|---|---|---|
| JP | 63135010 A | 6/1988 |
| JP | 2003249835 A | 9/2003 |
| JP | 2004112591 A | 4/2004 |
| WO | 2010047113 A1 | 4/2010 |
| WO | 2015198904 A1 | 12/2015 |

OTHER PUBLICATIONS

International Search Report in PCT/JP2021/034802, mailed Dec. 7, 2021, 3 pages.
Written Opinion in PCT/JP2021/034802, mailed Dec. 7, 2021, 5 pages.

* cited by examiner

*Primary Examiner* — Jorge L Salazar, Jr.
(74) *Attorney, Agent, or Firm* — Keating & Bennett, LLP

(57) ABSTRACT

An acoustic wave device includes a piezoelectric substrate, a first interdigital transducer electrode on the piezoelectric substrate, and a first reflector and a second reflector. The first interdigital transducer electrode, the first reflector, and the second reflector each include a plurality of electrode fingers. At least one of the first interdigital transducer electrode, the first reflector, and the second reflector has a nonuniform duty ratio area where three successive electrode fingers in an acoustic wave propagation direction all have different duty ratios.

18 Claims, 7 Drawing Sheets

ACOUSTIC WAVE DEVICE

CROSS REFERENCE TO RELATED APPLICATIONS

This application claims the benefit of priority to Japanese Patent Application No. 2020-163568 filed on Sep. 29, 2020 and is a Continuation Application of PCT Application No. PCT/JP2021/034802 filed on Sep. 22, 2021. The entire contents of each application are hereby incorporated herein by reference.

BACKGROUND OF THE INVENTION

1. Field of the Invention

The present invention relates to an acoustic wave device.

2. Description of the Related Art

Acoustic wave devices have been widely used, for example, in filters of mobile phones. Japanese Unexamined Patent Application Publication No. 2004-112591 discloses an example of a longitudinally coupled resonator-type acoustic wave filter serving as an acoustic wave device. This acoustic wave device includes a plurality of comb electrode arrays on a piezoelectric substrate. Each comb electrode array includes a pair of comb electrodes. One and the other comb electrodes of each comb electrode array have different duty ratios. This improves insertion loss.

SUMMARY OF THE INVENTION

When an acoustic wave device, such as that described in Japanese Unexamined Patent Application Publication No. 2004-112591, is used, the occurrence of unwanted resonance may lead to degradation of filter characteristics. Particularly in a longitudinally coupled resonator-type acoustic wave filter configured to form an attenuation region using a longitudinal mode, the intensity of the longitudinal mode increases and a response level in the attenuation region may be degraded.

Preferred embodiments of the present invention provide acoustic wave devices that each improve a response level in an attenuation region outside a pass band.

An acoustic wave device according to a broad aspect of a preferred embodiment of the present invention includes a piezoelectric substrate, an interdigital transducer (IDT) electrode on the piezoelectric substrate, and a first reflector and a second reflector on the piezoelectric substrate and on both sides of the interdigital transducer electrode in an acoustic wave propagation direction. The interdigital transducer electrode, the first reflector, and the second reflector each include a plurality of electrode fingers. At least one of the interdigital transducer electrode, the first reflector, and the second reflector has a nonuniform duty ratio area where three successive electrode fingers in the acoustic wave propagation direction all have different duty ratios.

An acoustic wave device according to another broad aspect of another preferred embodiment of the present invention includes a piezoelectric substrate, an interdigital transducer electrode on the piezoelectric substrate, and a first reflector and a second reflector on the piezoelectric substrate and on both sides of the interdigital transducer electrode in an acoustic wave propagation direction. The interdigital transducer electrode, the first reflector, and the second reflector each include a plurality of electrode fingers. When a value obtained by dividing a width of any electrode finger by an average width of all the electrode fingers of the interdigital transducer electrode, the first reflector, and the second reflector is defined as an average width ratio of the electrode finger, at least one of the interdigital transducer electrode, the first reflector, and the second reflector has a nonuniform average width ratio area where three successive electrode fingers in the acoustic wave propagation direction all have different average width ratios.

The acoustic wave devices according to preferred embodiments of the present invention each improve the response level in the attenuation region outside the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will now be described by explaining preferred embodiments of the present invention with reference to the drawings.

Note that the preferred embodiments described in the present specification are presented for illustrative purposes, and that some components described in different preferred embodiments can be replaced or combined.

Figure 1:
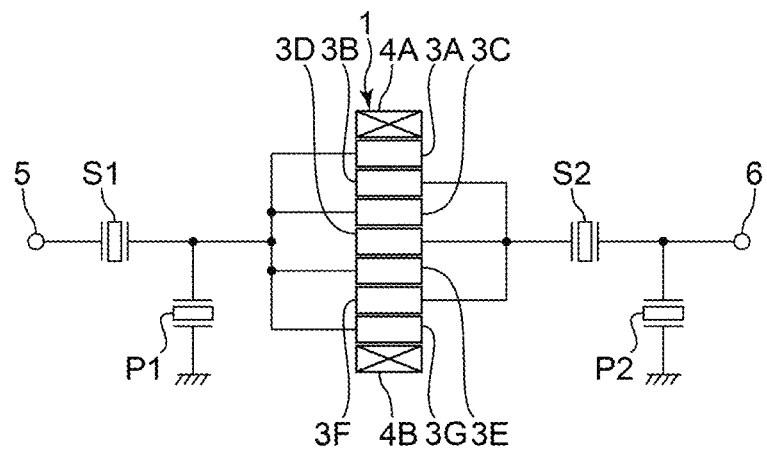
FIG. 1 is a circuit diagram of a filter apparatus including an acoustic wave device according to a first preferred embodiment of the present invention.

FIG. 1 is a circuit diagram of a filter apparatus including an acoustic wave device according to a first preferred embodiment of the present invention. FIG. 1 schematically illustrates an acoustic wave device 1.

The acoustic wave device 1 of the present preferred embodiment is a longitudinally coupled resonator-type acoustic wave filter. A filter apparatus 10 includes the acoustic wave device 1. The filter apparatus 10 is a filter apparatus according to a preferred embodiment of the present invention. The filter apparatus 10 is a receiving filter. The filter apparatus 10 may be a transmitting filter. A circuit configuration of the filter apparatus 10 is not particularly limited. The filter apparatus 10 is simply required to include the acoustic wave device 1 according to a preferred embodiment of the present invention.

Figure 2:
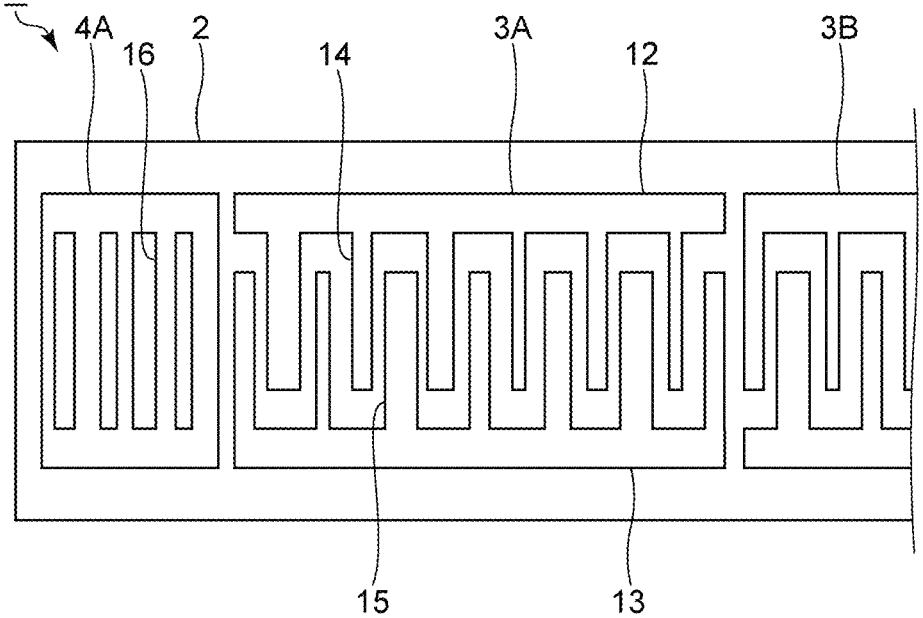
FIG. 2 is a schematic plan view of an area including a first reflector and a first interdigital transducer electrode of the acoustic wave device according to the first preferred embodiment of the present invention.

FIG. 2 is a schematic plan view of an area including a first reflector and a first interdigital transducer electrode of the acoustic wave device according to the first preferred embodiment of the present invention. No wires connected to the acoustic wave device 1 are shown in FIG. 2. The same applies to the other plan views, as well as to FIG. 2.

The acoustic wave device 1 is a seven-interdigital-transducer longitudinally coupled resonator-type acoustic wave filter. The acoustic wave device 1 includes a piezoelectric substrate 2. A plurality of interdigital transducer electrodes are disposed on the piezoelectric substrate 2. Acoustic waves are excited by applying an alternating-current voltage to each of the interdigital transducer electrodes. In the present preferred embodiment, surface acoustic waves are excited in the acoustic wave device 1. The plurality of interdigital transducer electrodes are arranged along the acoustic wave propagation direction. A pair of reflectors is disposed on the piezoelectric substrate and arranged on both sides of the plurality of interdigital transducer electrodes in the acoustic wave propagation direction. Specifically, the pair of reflectors includes a first reflector 4A and a second reflector 4B illustrated in FIG. 1. The plurality of interdigital transducer electrodes include a first interdigital transducer electrode a second 3A, interdigital transducer electrode 3B, a third interdigital transducer electrode 3C, a fourth interdigital transducer electrode 3D, a fifth interdigital transducer electrode 3E, a sixth interdigital transducer electrode 3F, and a seventh interdigital transducer electrode 3G arranged in this order from the first reflector 4A. The number of interdigital transducer electrodes included in the acoustic wave device 1 is not limited to seven. For example, the acoustic wave device 1 may be of a three-interdigital-transducer type or five-interdigital-transducer type.

As illustrated in FIG. 2, the first interdigital transducer electrode 3A includes a pair of busbars and a plurality of electrode fingers. The pair of busbars includes a first busbar 12 and a second busbar 13. The first busbar 12 and the second busbar 13 are opposite each other. The plurality of electrode fingers of the first interdigital transducer electrode 3A include a plurality of first electrode fingers 14 and a plurality of second electrode fingers 15. The plurality of first electrode fingers 14 are each connected at one end thereof to the first busbar 12. The plurality of second electrode fingers 15 are each connected at one end thereof to the second busbar 13. The plurality of first electrode fingers 14 and the plurality of second electrode fingers 15 are interdigitated with each other. Like the first interdigital transducer electrode 3A, the other interdigital transducer electrodes each include a pair of busbars and a plurality of electrode fingers.

The first reflector 4A includes a plurality of electrode fingers 16. Similarly, the second reflector 4B includes a plurality of electrode fingers. The interdigital transducer electrodes, the first reflector 4A, and the second reflector 4B of the present preferred embodiment have the same electrode finger pitch. The electrode finger pitch refers to a center-to-center distance between adjacent electrode fingers. It is not necessarily required that all the electrode finger pitches of the interdigital transducer electrodes, the first reflector 4A, and the second reflector 4B be the same.

In the present specification, the duty ratio is defined for each electrode finger. That is, in each of the interdigital transducer electrodes, the first reflector 4A, and the second reflector 4B, a value obtained by dividing the width of any electrode finger by the electrode finger pitch is defined as the duty ratio of the electrode finger. Specifically, $d=w/p$ is satisfied, where d is the duty ratio, w is the width of the electrode finger, and p is the electrode finger pitch. The width of the electrode finger is a dimension of the electrode finger along the acoustic wave propagation direction.

An area where three successive electrode fingers in the acoustic wave propagation direction all have different duty ratios is defined as a nonuniform duty ratio area. In the present specification, the electrode finger pitch used to calculate the duty ratio is the average of center-to-center distances between any electrode finger and electrode fingers on both sides thereof. Details of the electrode finger pitch and an example of the nonuniform duty ratio area will now be described with reference to FIG. 3.

Figure 3:
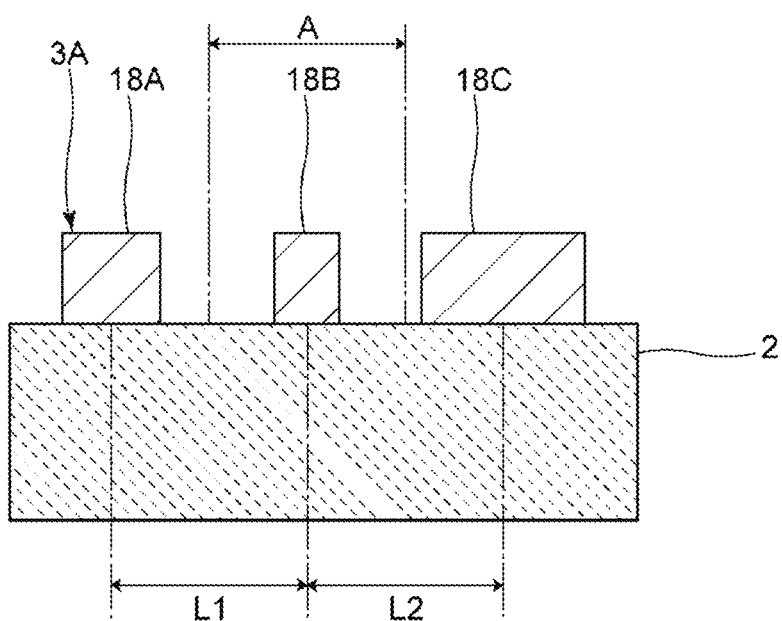
FIG. 3 is a schematic elevational cross-sectional view of an area including three successive electrode fingers in the acoustic wave propagation direction, in the first interdigital transducer electrode according to the first preferred embodiment of the present invention.

FIG. 3 is a schematic elevational cross-sectional view of an area including three successive electrode fingers in the acoustic wave propagation direction, in the first interdigital transducer electrode according to the first preferred embodiment. An electrode finger 18A is an electrode finger at one end of the first interdigital transducer electrode 3A in the acoustic wave propagation direction. The electrode finger 18A, an electrode finger 18B, and an electrode finger 18C are three successive electrode fingers in the acoustic wave propagation direction.

The electrode finger pitch used to calculate the duty ratio of the electrode finger 18B illustrated in FIG. 3 is the average of a center-to-center distance L1 between the electrode finger 18B and the electrode finger 18A and a center-to-center distance L2 between the electrode finger 18B and the electrode finger 18C. Specifically, the electrode finger pitch used to calculate the duty ratio of the electrode finger 18B is equal to a distance A from the center between the center of the electrode finger 18B and the center of the electrode finger 18A to the center between the center of the electrode finger 18B and the center of the electrode finger 18C.

On the other hand, the electrode finger pitch used to calculate the duty ratio of an electrode finger at one or the other end in the acoustic wave propagation direction is the center-to-center distance between the electrode finger and another electrode finger adjacent thereto. For example, the electrode finger pitch used to calculate the duty ratio of the electrode finger 18A illustrated in FIG. 3 is the center-to-center distance L1 between the electrode finger 18A and the electrode finger 18B. The same applies to the first reflector 4A and the second reflector 4B.

Although the electrode finger pitches are uniform in the area illustrated in FIG. 3, the electrode finger 18A, the electrode finger 18B, and the electrode finger 18C all have different widths. This means that the illustrated area is a nonuniform duty ratio area.

One of the unique features of the present preferred embodiment is that at least one of the plurality of interdigital transducer electrodes, the first reflector 4A, and the second reflector 4B has a nonuniform duty ratio area. This can improve the response level in the attenuation region outside the pass band. Details of this effect will now be described along with details of the present preferred embodiment.

Figure 4:
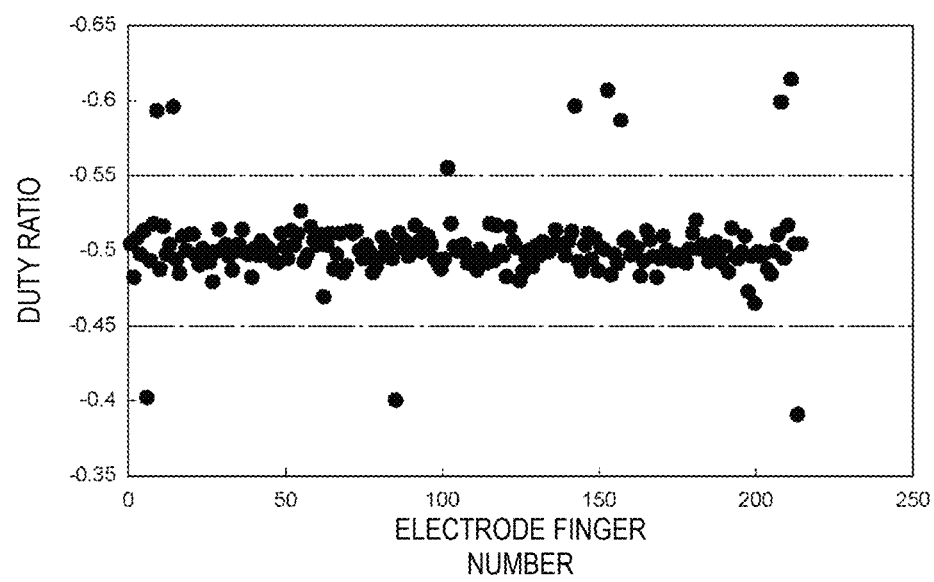
FIG. 4 is a diagram illustrating the duty ratio of each electrode finger of a plurality of interdigital transducer electrodes, the first reflector, and a second reflector in the first preferred embodiment of the present invention.

FIG. 4 is a diagram illustrating the duty ratio of each electrode finger of the plurality of interdigital transducer electrodes, the first reflector, and the second reflector in the first preferred embodiment. The electrode finger number represented by the horizontal axis of FIG. 4 increases in the direction from the first reflector 4A toward the second reflector 4B.

In the present preferred embodiment, the duty ratios in the plurality of interdigital transducer electrodes, the first reflector 4A, and the second reflector 4B are random. The entire area of the plurality of interdigital transducer electrodes, the first reflector 4A, and the second reflector 4B is a nonuniform duty ratio area. In the acoustic wave device 1, the minimum duty ratio is about 0.39, the maximum duty ratio is about 0.62, and the average duty ratio is about 0.5, for example. In the acoustic wave device 1, about 95% of the duty ratios of all the electrode fingers are greater than or equal to about 0.45 and less than or equal to about 0.55, for example. In the acoustic wave device 1, the standard deviation in the distribution of all the duty ratios in the plurality of interdigital transducer electrodes, the first reflector 4A, and the second reflector 4B is about 0.024, for example.

The circuit configuration of the filter apparatus 10 according to the present preferred embodiment is as illustrated in FIG. 1. Specifically, the filter apparatus 10 includes a first signal terminal 5 and a second signal terminal 6. The first signal terminal 5 is an antenna terminal. The first signal terminal 5 is connected to an antenna. The first signal terminal 5 and the second signal terminal 6 may be configured as electrode pads, or may be configured as wires. The filter apparatus 10 further includes an acoustic wave resonator S1, an acoustic wave resonator S2, an acoustic wave resonator P1, and an acoustic wave resonator P2. The acoustic wave resonator S1 and the acoustic wave resonator S2 are series traps. The acoustic wave resonator S1 is connected between the first signal terminal 5 and the acoustic wave device 1. The acoustic wave resonator S2 is connected between the acoustic wave device 1 and the second signal terminal 6. The acoustic wave resonator P1 and the acoustic wave resonator P2 are parallel traps. The acoustic wave resonator P1 is connected between a ground potential and a node between the acoustic wave resonator S1 and the acoustic wave device 1. The acoustic wave resonator P2 is connected between the second signal terminal 6 and the ground potential.

In the present preferred embodiment, as described above, it is possible to improve the response level in the attenuation region outside the pass band. This effect will now be described by comparing the filter apparatus 10 with the first comparative example. A filter apparatus according to the first comparative example differs from the present preferred embodiment in that the duty ratios in each of a plurality of interdigital transducer electrodes, a first reflector, and a second reflector of a longitudinally coupled resonator-type acoustic wave filter are uniform.

Figure 5:
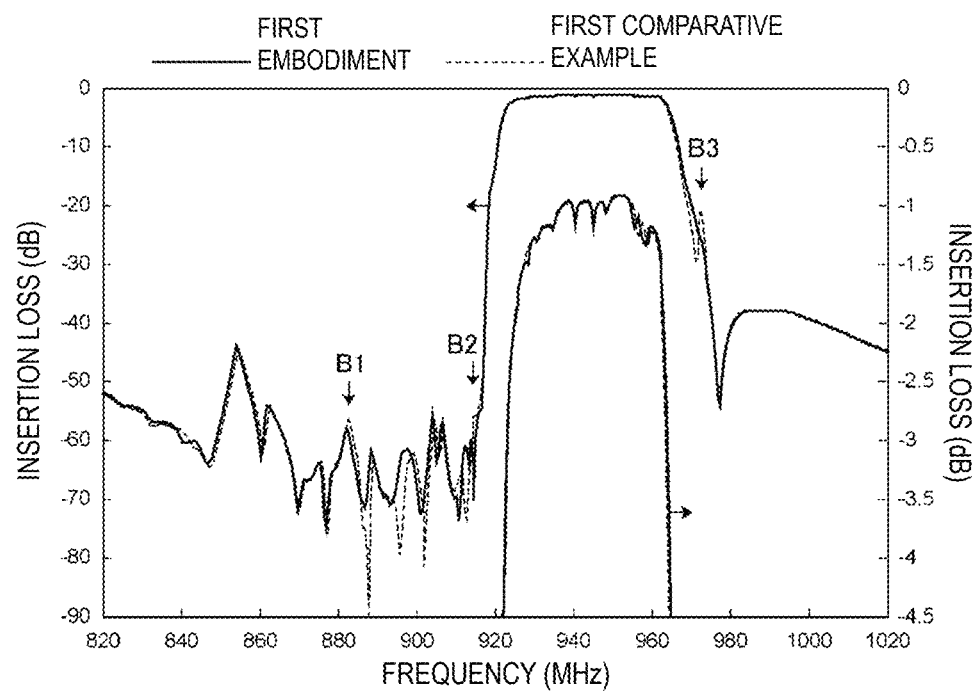
FIG. 5 is a diagram illustrating attenuation-frequency characteristics of the filter apparatus including the acoustic wave device according to the first preferred embodiment of the present invention and a first comparative example.

FIG. 5 is a diagram illustrating attenuation-frequency characteristics of the filter apparatus including the acoustic wave device according to the first preferred embodiment and the first comparative example.

As indicated by arrow B1, arrow B2, and arrow B3 in FIG. 5, the response level corresponding to the unwanted wave outside the pass band is high in the first comparative example. In the first preferred embodiment, on the other hand, the response level corresponding to the unwanted wave is low. In particular, as indicated by arrow B1, the response level in the attenuation region outside the pass band can be improved in the first preferred embodiment.

In the first comparative example, where the duty ratios are uniform, signals reflected from adjacent electrode fingers are in phase and this may cause unwanted resonance. In the first preferred embodiment having a nonuniform duty ratio area, however, signals reflected from adjacent electrode fingers in the nonuniform duty ratio area are less likely to be in phase. This lowers the Q factor related to the resonance of an unwanted wave, such as a longitudinal mode, indicated by arrow B1. Therefore, it is possible to suppress unwanted resonance and improve the response level corresponding to the unwanted wave.

In the filter apparatus 10, the standard deviation in the distribution of all the duty ratios in the plurality of interdigital transducer electrodes, the first reflector 4A, and the second reflector 4B of the acoustic wave device 1 was varied to measure the response level outside the pass band. The response level was measured at the frequency corresponding to arrow B1 in FIG. 5.

Figure 6:
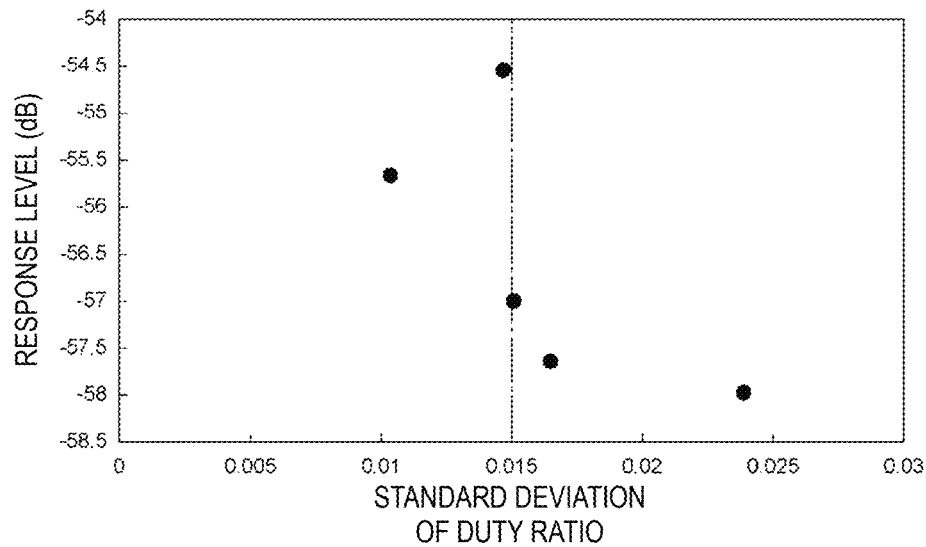
FIG. 6 is a diagram illustrating a relation between the standard deviation of the duty ratio and the response level outside the pass band of the filter apparatus including the acoustic wave device according to the first preferred embodiment of the present invention.

FIG. 6 is a diagram illustrating a relation between the standard deviation of the duty ratio and the response level outside the pass band of the filter apparatus including the acoustic wave device according to the first preferred embodiment.

FIG. 6 shows that when the standard deviation of the duty ratio is greater than or equal to about 0.015, the response level corresponding to a longitudinal mode, which is an unwanted wave, is lower than that when the standard deviation is less than about 0.015, for example. Therefore, it is preferable that the standard deviation in the distribution of all the duty ratios in the plurality of interdigital transducer electrodes, the first reflector 4A, and the second reflector 4B of the acoustic wave device 1 be greater than or equal to about 0.015, for example. This can further improve the response level in the attenuation region outside the pass band.

It is preferable that the standard deviation in the distribution of all the duty ratios in the plurality of interdigital transducer electrodes, the first reflector 4A, and the second reflector 4B of the acoustic wave device 1 be less than or equal to about 0.55, for example. This makes it less likely that filter characteristics, such as insertion loss, will be degraded.

In the distribution of all the duty ratios in the plurality of interdigital transducer electrodes, the first reflector 4A, and the second reflector 4B of the acoustic wave device 1, greater than or equal to about 95% of all the duty ratios are preferably within the range of $d_{ave}$±about 0.05, where $d_{ave}$ is the average duty ratio, for example. This makes it less likely that filter characteristics, such as insertion loss, will be degraded.

In the present preferred embodiment, as described above, the duty ratios in the plurality of interdigital transducer electrodes, the first reflector 4A, and the second reflector 4B are random. It is preferred, however, that at least one of the plurality of interdigital transducer electrodes, the first reflector 4A, and the second reflector 4B have a nonuniform duty ratio area. This can still improve the response level in the attenuation region outside the pass band.

In the present preferred embodiment, the interdigital transducer electrodes, the first reflector 4A, and the second reflector 4B have the same electrode finger pitch. However, the electrode fingers of the interdigital transducer electrodes, the first reflector 4A, and the second reflector 4B have random widths. This makes the duty ratios random. A value obtained by dividing the width of any electrode finger by the average width of all the electrode fingers of the plurality of interdigital transducer electrodes, the first reflector 4A, and the second reflector 4B is defined as the average width ratio of the electrode finger. Specifically, $wc=w/w_{ave}$ is satisfied, where wc is the average width ratio, w is the width of the electrode finger, and $w_{ave}$ is the average width of electrode fingers. An area where three successive electrode fingers in the acoustic wave propagation direction all have different average width ratios is defined as a nonuniform average width ratio area. In the acoustic wave device 1, the entire area of the plurality of interdigital transducer electrodes, the first reflector 4A, and the second reflector 4B is a nonuniform average width ratio area. It is preferred, however, that at least one of the plurality of interdigital transducer electrodes, the first reflector 4A, and the second reflector 4B have a nonuniform average width ratio area. This can still improve the response level in the attenuation region outside the pass band. It is not necessarily required that all the electrode finger pitches of the interdigital transducer electrodes, the first reflector 4A, and the second reflector 4B be the same.

As in the distribution of duty ratios described above, it is preferable that the standard deviation in the distribution of the average width ratios of all the electrode fingers of the plurality of interdigital transducer electrodes, the first reflector 4A, and the second reflector 4B of the acoustic wave device 1 be greater than or equal to about 0.015, for example. This can further improve the response level in the attenuation region outside the pass band. It is preferable that the standard deviation in the distribution of the average width ratios of all the electrode fingers of the plurality of interdigital transducer electrodes, the first reflector 4A, and the second reflector 4B of the acoustic wave device 1 be less than or equal to about 0.55, for example. This makes it less likely that filter characteristics, such as insertion loss, will be degraded.

In the distribution of the average width ratios of all the electrode fingers of the plurality of interdigital transducer electrodes, the first reflector 4A, and the second reflector 4B of the acoustic wave device 1, greater than or equal to about 95% of all the average width ratios are preferably within the range of about 1±0.05, for example. This makes it less likely that filter characteristics, such as insertion loss, will be degraded.

Figure 7:
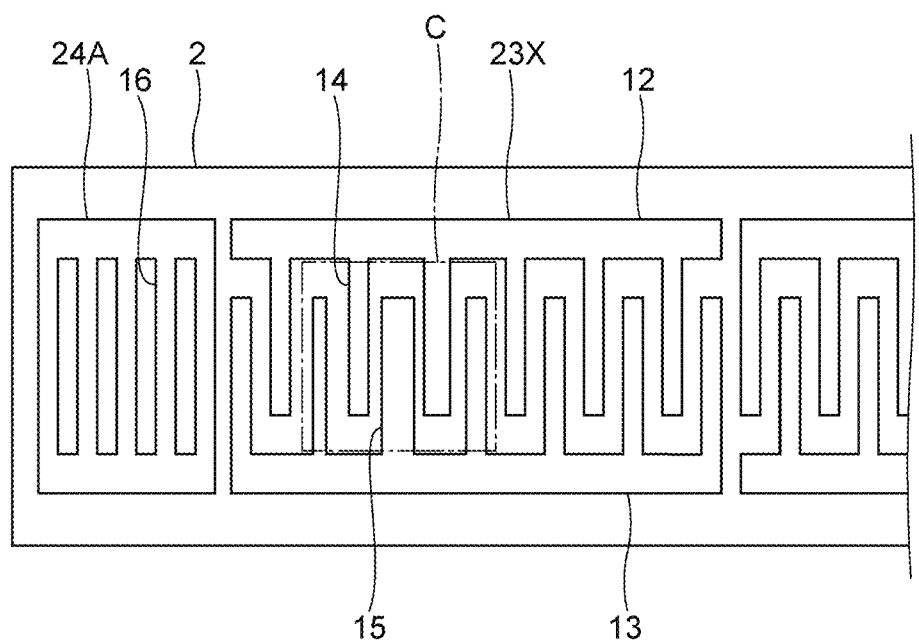
FIG. 7 is a schematic plan view of an area including a first reflector and a first interdigital transducer electrode of an acoustic wave device according to a first modification of the first preferred embodiment of the present invention.

FIG. 7 is a schematic plan view of an area including a first reflector and a first interdigital transducer electrode of an acoustic wave device according to a first modification of the first preferred embodiment.

In the present modification, a first interdigital transducer electrode 23X has an area where duty ratios are uniform and a nonuniform duty ratio area C. Specifically, in the first interdigital transducer electrode 23X, the duty ratios are uniform in the entire area except the nonuniform duty ratio area C. The first interdigital transducer electrode 23X may have a plurality of nonuniform duty ratio areas C. In this case, the areas where duty ratios are uniform and the nonuniform duty ratio areas C are alternately arranged. It is simply required that there be three or more electrode fingers in the nonuniform duty ratio area C. In the present modification, the duty ratios in a plurality of interdigital transducer electrodes other than the first interdigital transducer electrode 23X, a first reflector 24A, and a second reflector are uniform.

In the present modification, the nonuniform duty ratio area C is also a nonuniform average width ratio area. The first interdigital transducer electrode 23X has an area where the widths of electrode fingers are uniform and the nonuniform average width ratio area. The first interdigital transducer electrode 23X may have a plurality of nonuniform average width ratio areas. In this case, the areas where the widths of electrode fingers are uniform and the nonuniform average width ratio areas are alternately arranged. It is simply required that there be three or more electrode fingers in the nonuniform average width ratio area. In the present modification, the widths of electrode fingers in the plurality of interdigital transducer electrodes other than the first interdigital transducer electrode 23X, the first reflector 24A, and the second reflector are uniform. In the present modification, it is also possible to improve the response level in the attenuation region outside the pass band.

Figure 8:
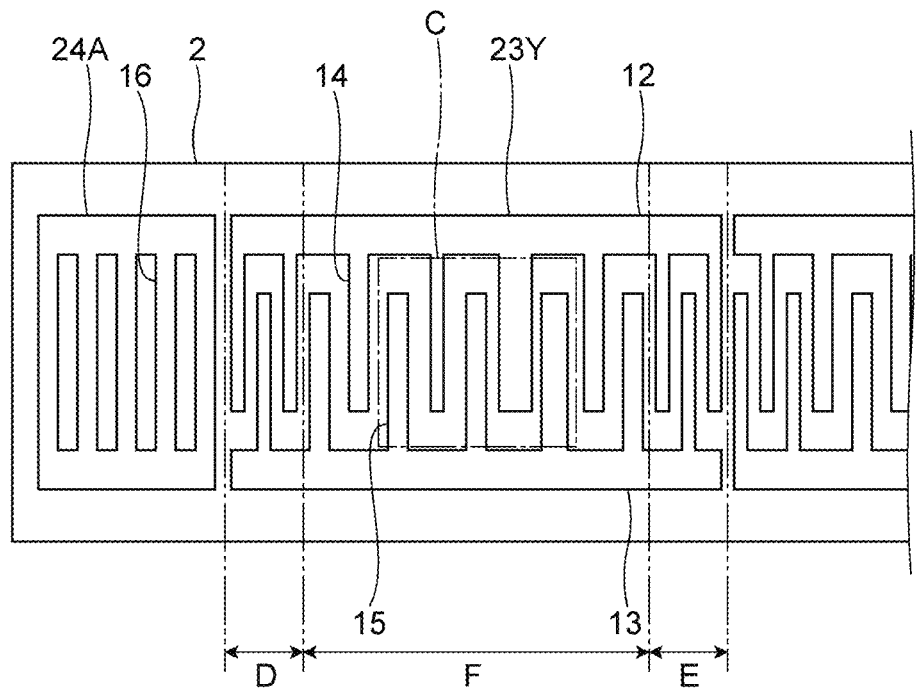
FIG. 8 is a schematic plan view of an area including the first reflector and a first interdigital transducer electrode of an acoustic wave device according to a second modification of the first preferred embodiment of the present invention.

FIG. 8 is a schematic plan view of an area including the first reflector and a first interdigital transducer electrode of an acoustic wave device according to a second modification of the first preferred embodiment.

In the present modification, a first interdigital transducer electrode 23Y includes a first region D, a second region E, and a third region F. The first region D is a region located at one end in the acoustic wave propagation direction. The second region E is a region located at the other end in the acoustic wave propagation direction. The third region F is a region adjacent to both the first region D and the second region E. The first region D and the second region E each include a plurality of electrode fingers. The electrode finger pitches in the first region D and the second region E are narrower than the electrode finger pitch in the other region.

In the present modification, the nonuniform duty ratio area C and the nonuniform average width ratio area include the electrode finger in the center of the first interdigital transducer electrode 23Y. Neither the nonuniform duty ratio area C nor the nonuniform average width ratio area is located at the boundary between the first region D and the third region F. Similarly, neither the nonuniform duty ratio area C nor the nonuniform average width ratio area is located at the boundary between and the second region E and the third region F. In the present modification, it is simply required that neither the nonuniform duty ratio area C nor the nonuniform average width ratio area be located at the boundaries described above. The nonuniform duty ratio area C and the nonuniform average width ratio area are not necessarily required to include the electrode finger in the center of the first interdigital transducer electrode 23Y. In the present modification, it is also possible to improve the response level in the attenuation region outside the pass band.

As illustrated in FIG. 3, in the present preferred embodiment, the piezoelectric substrate 2 is a piezoelectric substrate including only a piezoelectric layer. Examples of the material that can be used to form the piezoelectric layer include lithium tantalate, lithium niobate, zinc oxide, aluminum nitride, crystal, and lead zirconate titanate (PZT). The piezoelectric substrate 2 may be a multilayer substrate including a piezoelectric layer or layers.

Figure 9:
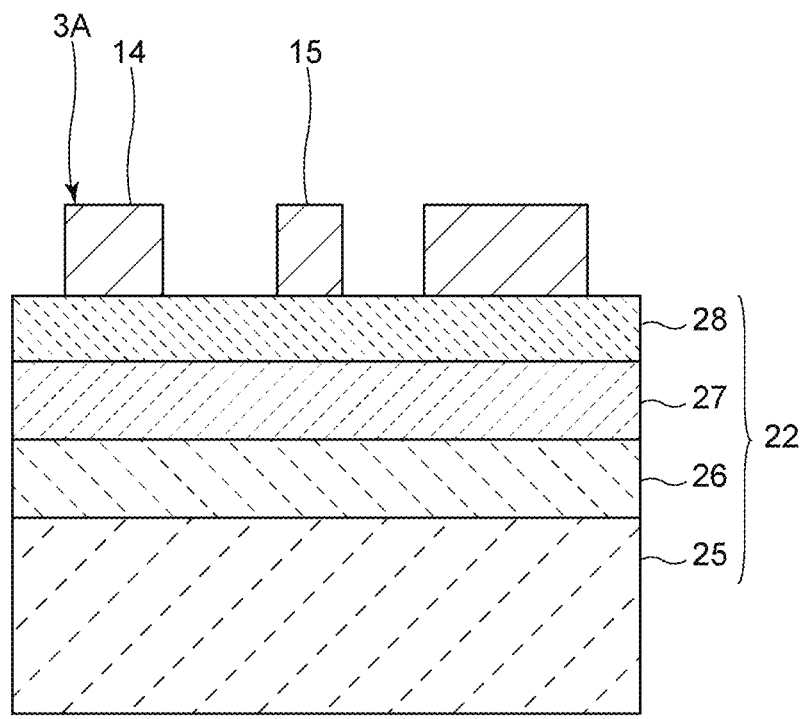
FIG. 9 is a schematic elevational cross-sectional view of an area including three successive electrode fingers in the acoustic wave propagation direction, in the first interdigital transducer electrode according to a third modification of the first preferred embodiment of the present invention.

FIG. 9 is a schematic elevational cross-sectional view of an area including three successive electrode fingers in the acoustic wave propagation direction, in the first interdigital transducer electrode according to a third modification of the first preferred embodiment.

In the present modification, a piezoelectric substrate 22 includes a support substrate 25, a high acoustic velocity film 26 serving as a high acoustic velocity material layer, a low acoustic velocity film 27, and a piezoelectric layer 28. Specifically, the high acoustic velocity film 26 is disposed on the support substrate 25. The low acoustic velocity film 27 is disposed on the high acoustic velocity film 26. The piezoelectric layer 28 is disposed on the low acoustic velocity film 27.

The low acoustic velocity film 27 is a film with a relatively low acoustic velocity. Specifically, the acoustic velocity of bulk waves propagating in the low acoustic velocity film 27 is lower than the acoustic velocity of bulk waves propagating in the piezoelectric layer 28. Examples of the material that can be used to form the low acoustic velocity film 27 include glass, silicon oxide, silicon oxynitride, lithium oxide, tantalum pentoxide, and a material mainly including a compound produced by adding fluorine, carbon, or boron to silicon oxide.

The high acoustic velocity material layer is a layer with a relatively high acoustic velocity. Specifically, the acoustic velocity of bulk waves propagating in the high acoustic velocity material layer is higher than the acoustic velocity of acoustic waves propagating in the piezoelectric layer 28. Examples of the material that can be used to form the high acoustic velocity material layer include silicon, aluminum oxide, silicon carbide, silicon nitride, silicon oxynitride, sapphire, lithium tantalate, lithium niobate, crystal, alumina, zirconia, cordierite, mullite, steatite, forsterite, magnesia, a diamond-like carbon (DLC) film, and a medium such as diamond mainly including any of the materials described above.

Examples of the material that can be used to form the support substrate 25 include piezoelectric materials, such as aluminum oxide, lithium tantalate, lithium niobate, and crystal; various ceramics, such as alumina, sapphire, magnesia, silicon nitride, aluminum nitride, silicon carbide, zirconia, cordierite, mullite, steatite, and forsterite; dielectrics, such as diamond and glass; semiconductors, such as silicon and gallium nitride; and resin.

The piezoelectric substrate 22 of the present modification includes a stack of the high acoustic velocity material layer, the low acoustic velocity film 27, and the piezoelectric layer 28. This can effectively confine acoustic wave energy on the side of the piezoelectric layer 28, and can also improve the response level in the attenuation region outside the pass band, as in the first preferred embodiment.

The high acoustic velocity material layer may be a high acoustic velocity support substrate. In this case, the piezoelectric substrate may be a multilayer substrate including the high acoustic velocity support substrate, the low acoustic velocity film 27, and the piezoelectric layer 28. In the third modification, the piezoelectric layer 28 is indirectly disposed on the high acoustic velocity material layer, with the low acoustic velocity film 27 interposed therebetween. The piezoelectric layer 28 may be directly disposed on the high acoustic velocity material layer. The piezoelectric substrate may be a multilayer substrate without the low acoustic velocity film 27. In this case, the piezoelectric substrate may be a multilayer substrate including the high acoustic velocity support substrate and the piezoelectric layer 28. The piezoelectric substrate may be a multilayer substrate including the support substrate 25, the high acoustic velocity film 26, and the piezoelectric layer 28. In any of the cases described above, it is still possible to effectively confine acoustic wave energy on the side of the piezoelectric layer 28, and to improve the response level in the attenuation region outside the pass band.

The piezoelectric layer 28 and an acoustic reflective film may define a layered body. The acoustic reflective film includes at least one low acoustic impedance layer and at least one high acoustic impedance layer. The low acoustic impedance layer is a layer with relatively low acoustic impedance. The high acoustic impedance layer is a layer with relatively high acoustic impedance. The low and high acoustic impedance layers are alternately stacked. This can also effectively confine acoustic wave energy on the side of the piezoelectric layer 28, and can improve the response level in the attenuation region outside the pass band, as in the first preferred embodiment.

In the first preferred embodiment and the modifications thereof described above, the acoustic wave device is a longitudinally coupled resonator-type acoustic wave filter, for example. Alternatively, an acoustic wave device according to a preferred embodiment of the present invention may be an acoustic wave resonator. This example will now be described in a second preferred embodiment.

Figure 10:
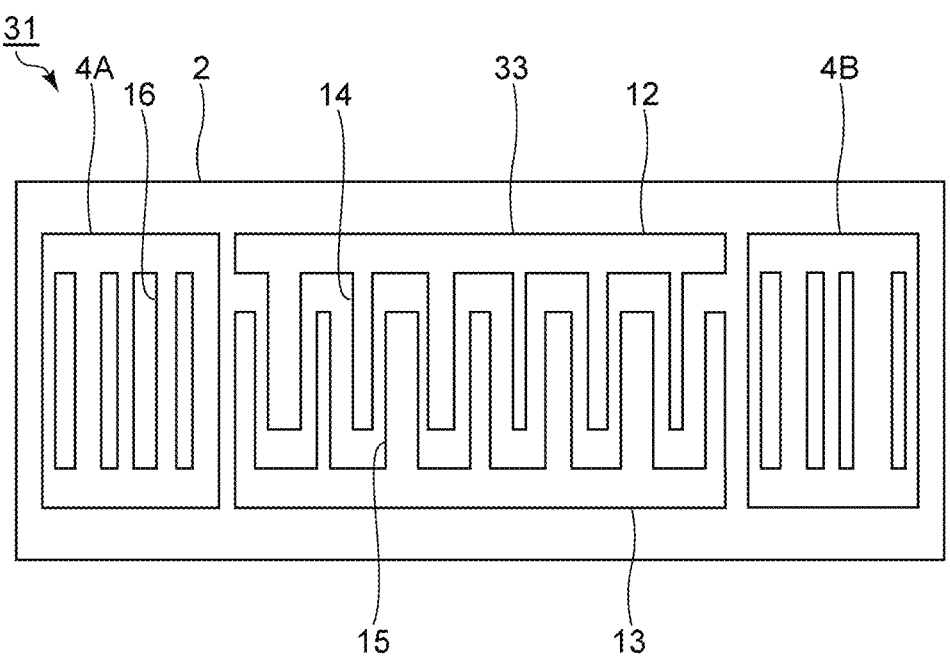
FIG. 10 is a schematic plan view of an acoustic wave device according to a second preferred embodiment of the present invention.

FIG. 10 is a schematic plan view of an acoustic wave device according to the second preferred embodiment.

An acoustic wave device 31 is an acoustic wave resonator. The acoustic wave device 31 includes one interdigital transducer electrode 33, the first reflector 4A, and the second reflector 4B. The duty ratios in the interdigital transducer electrode 33, the first reflector 4A, and the second reflector 4B are random. In the present preferred embodiment, the entire area of the interdigital transducer electrode 33, the first reflector 4A, and the second reflector 4B is a nonuniform duty ratio area. The electrode fingers of the interdigital transducer electrode 33, the first reflector 4A, and the second reflector 4B have random widths. The entire area of the interdigital transducer electrode 33, the first reflector 4A, and the second reflector 4B is a nonuniform average width ratio area. It is simply required, however, that at least one of the interdigital transducer electrode 33, the first reflector 4A, and the second reflector 4B have a nonuniform duty ratio area or a nonuniform average width ratio area.

In the present preferred embodiment, the interdigital transducer electrode 33, the first reflector 4A, and the second reflector 4B have the same electrode finger pitch. It is not necessarily required that all the electrode finger pitches of the interdigital transducer electrode 33, the first reflector 4A, and the second reflector 4B be the same.

Figure 11:
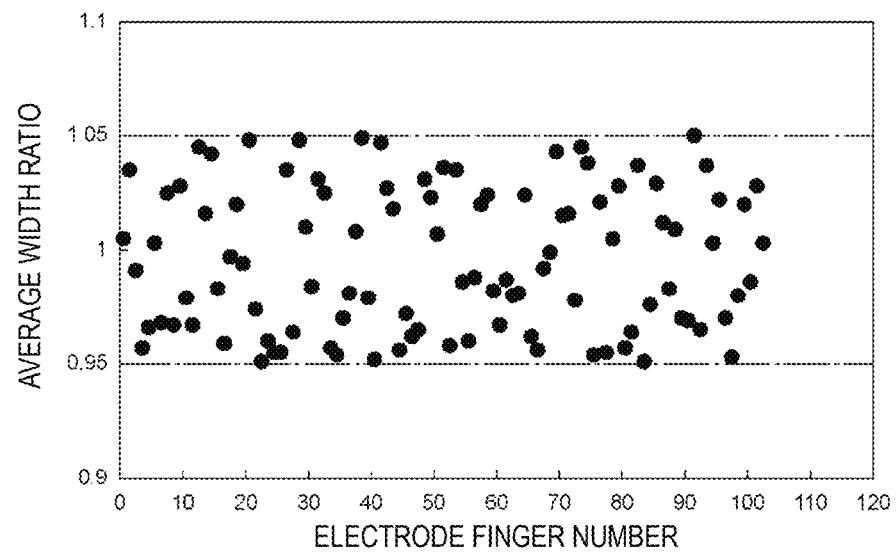
FIG. 11 is a diagram illustrating the average width ratio of each electrode finger of an interdigital transducer electrode, the first reflector, and the second reflector in the second preferred embodiment of the present invention.

FIG. 11 is a diagram illustrating the average width ratio of each electrode finger of the interdigital transducer electrode, the first reflector, and the second reflector in the second preferred embodiment. The electrode finger number represented by the horizontal axis of FIG. 11 increases in the direction from the first reflector 4A toward the second reflector 4B. Numbers 1 to 11 represent the respective electrode f fingers of the first reflector 4A, numbers 12 to 92 represent the respective electrode fingers of the interdigital transducer electrode 33, and numbers 93 to 103 represent the respective electrode fingers of the second reflector 4B.

As illustrated in FIG. 11, the average width ratios in the present preferred embodiment are greater than or equal to about 0.95 and less than or equal to about 1.05, for example. The standard deviation in the distribution of the average width ratios of all the electrode fingers of the interdigital transducer electrode 33, the first reflector 4A, and the second reflector 4B of the acoustic wave device 31 is about 0.024, for example. The design parameters of the acoustic wave device 31 are as listed below. As viewed in the acoustic wave propagation direction, a region where adjacent electrode fingers of the interdigital transducer electrode overlap is defined as an overlap region. A dimension along the direction in which a plurality of electrode fingers in the overlap region extend is defined as an overlap width. A center-to-center distance between an electrode finger at an end portion of the interdigital transducer electrode in the acoustic wave propagation direction and an electrode finger of a reflector closest to the interdigital transducer electrode is defined as an I-R gap.

Number of pairs of electrode fingers of interdigital transducer electrode 33: 40.5;
Overlap width of interdigital transducer electrode 33: about 50 μm;
Number of electrode fingers of first reflector 4A and second reflector 4B: 11;
Electrode finger pitch of interdigital transducer electrode 33, first reflector 4A, and second reflector 4B: about 4 μm; and
I-R gap: about 4 μm.

In the present preferred embodiment, it is possible, as in the first preferred embodiment, to improve the response level in the attenuation region outside the pass band. This will be described by comparing a filter apparatus including the acoustic wave device 31 of the present preferred embodiment with a second comparative example. A filter apparatus of the second comparative example differs from the present preferred embodiment in that the duty ratios and the widths of electrode fingers are uniform in each of the interdigital transducer electrode, the first reflector, and the second reflector of the acoustic wave resonator.

Figure 12:
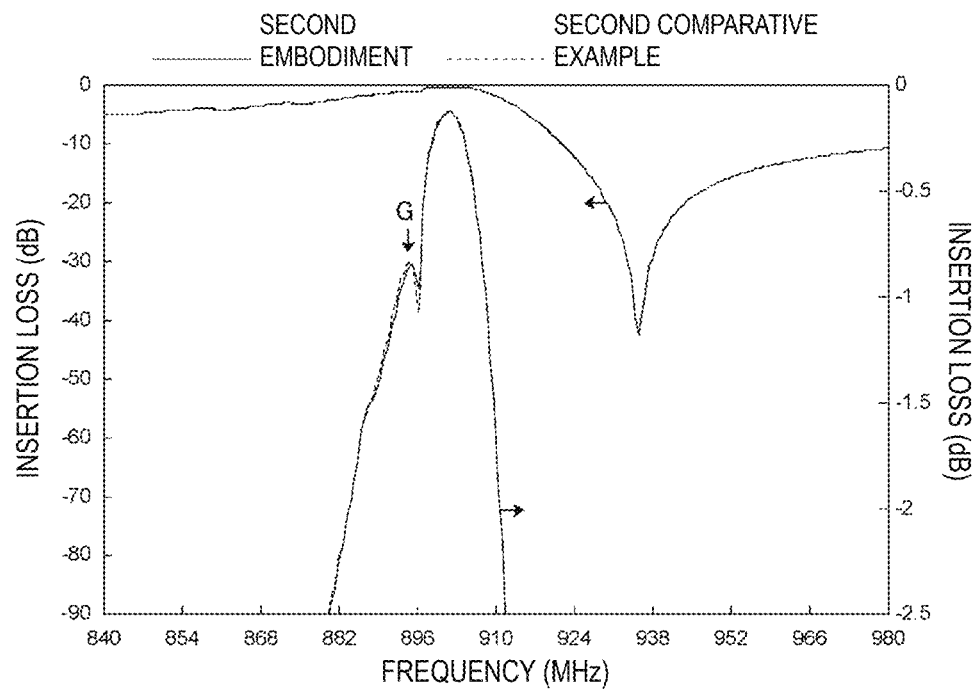
FIG. 12 is a diagram illustrating attenuation-frequency characteristics of a filter apparatus including the acoustic wave device according to the second preferred embodiment of the present invention and a second comparative example.

FIG. 12 is a diagram illustrating attenuation-frequency characteristics of the filter apparatus including the acoustic wave device according to the second preferred embodiment and the second comparative example. Arrow G in FIG. 12 indicates a longitudinal mode ripple.

FIG. 12 shows that the longitudinal mode ripple is more suppressed in the second preferred embodiment than in the second comparative example. This means that the response caused by the longitudinal mode ripple can be suppressed in the second preferred embodiment. Accordingly, for example, when a filter apparatus or a multiplexer includes the acoustic wave device 31 of the second preferred embodiment, the response level in the attenuation region outside the pass band can be improved.

The standard deviation in the distribution of the average width ratios of all the electrode fingers of the interdigital transducer electrode 33, the first reflector 4A, and the second reflector 4B of the acoustic wave device 31 was varied to measure the response level outside the pass band. The response level was measured at the frequency corresponding to arrow G in FIG. 12.

Figure 13:
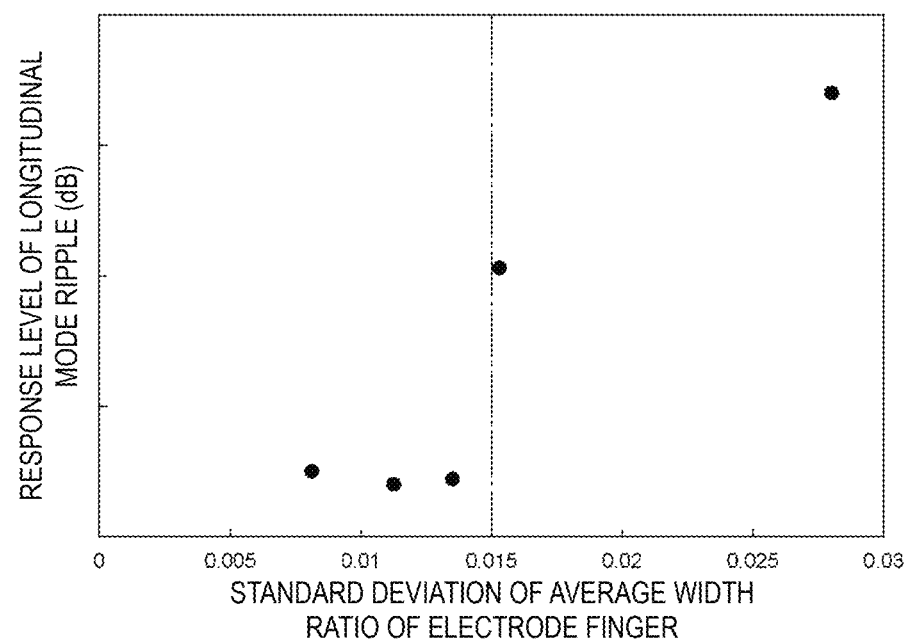
FIG. 13 is a diagram illustrating a relation between the standard deviation of the average width ratio of an electrode finger and the response level of a longitudinal mode ripple in the filter apparatus including the acoustic wave device according to the second preferred embodiment of the present invention.

FIG. 13 is a diagram illustrating a relation between the standard deviation of the average width ratio of the electrode finger and the response level of the longitudinal mode ripple in the filter apparatus including the acoustic wave device according to the second preferred embodiment. FIG. 13 shows that the longitudinal mode is more suppressed at a higher position in the vertical axis.

FIG. 13 shows that when the standard deviation of the average width ratio of the electrode finger is greater than or equal to about 0.015, the longitudinal mode ripple is more suppressed than when the standard deviation is less than about 0.015, for example. Therefore, the response level in the attenuation region outside the pass band can be further improved in this case.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate;
an interdigital transducer electrode on the piezoelectric substrate; and
a first reflector and a second reflector on the piezoelectric substrate and on both sides of the interdigital transducer electrode in an acoustic wave propagation direction; wherein
the interdigital transducer electrode, the first reflector, and the second reflector each include a plurality of electrode fingers;
at least one of the interdigital transducer electrode, the first reflector, and the second reflector has a nonuniform duty ratio area where three successive electrode fingers in the acoustic wave propagation direction all have different duty ratios; and
a standard deviation in a distribution of all duty ratios in the interdigital transducer electrode, the first reflector, and the second reflector is greater than or equal to about 0.015.

2. A filter apparatus comprising:
the acoustic wave device according to claim 1.

3. A filter apparatus according to claim 2, wherein the filter apparatus is a receiving filter.

4. A filter apparatus according to claim 2, wherein the filter apparatus is a transmitting filter.

5. The acoustic wave device according to claim 1, wherein the interdigital transducer electrode, the first reflector, and the second reflector each have an area where duty ratios are uniform or substantially uniform.

6. The acoustic wave device according to claim 1, wherein the acoustic wave device is an acoustic wave resonator including one interdigital transducer electrode.

7. The acoustic wave device according to claim 1, wherein
the acoustic wave device is a longitudinally coupled resonator acoustic wave filter including a plurality of interdigital transducer electrodes; and
the plurality of interdigital transducer electrodes are positioned along the acoustic wave propagation direction.

8. The acoustic wave device according to claim 1, wherein electrode finger pitches in the nonuniform duty ratio area are equal or substantially equal.

9. An acoustic wave device comprising:
a piezoelectric substrate;
an interdigital transducer electrode on the piezoelectric substrate; and a first reflector and a second reflector on the piezoelectric substrate and on both sides of the interdigital transducer electrode in an acoustic wave propagation direction; wherein the interdigital transducer electrode, the first reflector, and the second reflector each include a plurality of electrode fingers;

when a value obtained by dividing a width of any of the electrode fingers by an average width of all the electrode fingers of the interdigital transducer electrode, the first reflector, and the second reflector is defined as an average width ratio of the electrode finger, at least one of the interdigital transducer electrode, the first reflector, and the second reflector has a nonuniform average width ratio area where three successive electrode fingers in the acoustic wave propagation direction all have different average width ratios; and a standard deviation in a distribution of widths of all the electrode fingers of the interdigital transducer electrode, the first reflector, and the second reflector is greater than or equal to about 0.015.

10. A filter apparatus comprising:
the acoustic wave device according to claim 9.

11. A filter apparatus according to claim 10, wherein the filter apparatus is a receiving filter.

12. A filter apparatus according to claim 10, wherein the filter apparatus is a transmitting filter.

13. The acoustic wave device according to claim 9, wherein the acoustic wave device is an acoustic wave resonator including one interdigital transducer electrode.

14. The acoustic wave device according to claim 9, wherein
the acoustic wave device is a longitudinally coupled resonator acoustic wave filter including a plurality of interdigital transducer electrodes; and
the plurality of interdigital transducer electrodes are positioned along the acoustic wave propagation direction.

15. The acoustic wave device according to claim 9, wherein electrode finger pitches in the nonuniform average width ratio area are equal or substantially equal.

16. The acoustic wave device according to claim 9, wherein the interdigital transducer electrode, the first reflector, and the second reflector each have an area where duty ratios are uniform or substantially uniform.

17. An acoustic wave device comprising:
a piezoelectric substrate;
an interdigital transducer electrode on the piezoelectric substrate; and
a first reflector and a second reflector on the piezoelectric substrate and on both sides of the interdigital transducer electrode in an acoustic wave propagation direction; wherein the interdigital transducer electrode, the first reflector, and the second reflector each include a plurality of electrode fingers;

when a value obtained by dividing a width of any of the electrode fingers by an average width of all the electrode fingers of the interdigital transducer electrode, the first reflector, and the second reflector is defined as an average width ratio of the electrode finger, at least one of the interdigital transducer electrode, the first reflector, and the second reflector has a nonuniform average width ratio area where three successive electrode fingers in the acoustic wave propagation direction all have different average width ratios;

the interdigital transducer electrode includes a first region including the electrode finger at one end of the interdigital transducer electrode in the acoustic wave propagation direction and a second region including the electrode finger at the other end of the interdigital transducer electrode in the acoustic wave propagation direction; and the nonuniform average width ratio area is located outside a boundary between the first region and a region adjacent to the first region and outside a boundary between the second region and a region adjacent to the second region.

18. An acoustic wave device comprising:
a piezoelectric substrate;
an interdigital transducer electrode on the piezoelectric substrate; and
a first reflector and a second reflector on the piezoelectric substrate and on both sides of the interdigital transducer electrode in an acoustic wave propagation direction; wherein the interdigital transducer electrode, the first reflector, and the second reflector each include a plurality of electrode fingers;

at least one of the interdigital transducer electrode, the first reflector, and the second reflector has a nonuniform duty ratio area where three successive electrode fingers in the acoustic wave propagation direction all have different duty ratios;

the interdigital transducer electrode includes a first region including the electrode finger at one end of the interdigital transducer electrode in the acoustic wave propagation direction, a second region including the electrode finger at the other end of the interdigital transducer electrode in the acoustic wave propagation direction, and a third region adjacent to both the first region and the second region; and the nonuniform duty ratio area is located outside a boundary between the first region and the third region and outside a boundary between the second region and the third region.

* * * * *